(12) United States Patent
Tsou (10) Patent No.: US 8,928,837 B2
(45) Date of Patent: Jan. 6, 2015

(54) CIRCUIT SUBSTRATE AND LIGHT EMITTING DIODE PACKAGE

(75) Inventor: Wen-Chieh Tsou, New Taipei (TW)

(73) Assignee: Everlight Electronics Co., Ltd. (TW)

( * ) Notice: Subject to any disclaimer, the term of this patent is extended or adjusted under 35 U.S.C. 154(b) by 320 days.

(21) Appl. No.: 13/221,041

(22) Filed: Aug. 30, 2011

(65) Prior Publication Data

US 2011/0308851 A1    Dec. 22, 2011

Related U.S. Application Data

(62) Division of application No. 12/369,729, filed on Feb. 11, 2009.

(51) Int. Cl.
| | | |
|---|---|---|
| G02F 1/1333 | (2006.01) |
| G02F 1/1335 | (2006.01) |
| G02F 1/1343 | (2006.01) |
| H01L 33/00 | (2010.01) |
| H01L 33/62 | (2010.01) |
| H01L 33/48 | (2010.01) |

(52) U.S. Cl.
CPC .............. *H01L 33/62* (2013.01); *H01L 33/483* (2013.01); *H01L 2224/48091* (2013.01)
USPC ................. 349/61; 349/70; 349/71; 349/149; 349/150; 349/152; 257/81; 257/82; 257/84; 257/98; 257/99

(58) Field of Classification Search
CPC ..................... G09G 2320/0233; G09G 3/3406; G02F 1/1345; G02F 1/13452; G02F 1/1343; G02F 1/134309; G02F 1/13458; G02F 1/133603; G02F 1/1336; G02F 1/133608; G02F 2001/133325; G02F 2001/133612; G02F 1/133345; G02F 2201/42; G02F 2001/133331; H01L 23/49838; H01L 2924/12041; H01L 33/08; H01L 33/36; H01L 23/4985; H01L 27/3276; H01L 27/3288; H01L 29/78603; H01L 51/5203; H05K 2201/10681; H05K 2201/10977; G02B 6/0088; G02B 6/009; H05B 33/10; H05B 33/0824
USPC .......... 349/149, 150, 152, 61–70; 257/81–82, 257/84, 98–100
See application file for complete search history.

(56) References Cited

U.S. PATENT DOCUMENTS

| | | | |
|---|---|---|---|
| 6,383,835 B1 * | 5/2002 | Hata et al. ........................ 438/65 |
| 6,534,799 B1 | 3/2003 | Wang et al. |

(Continued)

FOREIGN PATENT DOCUMENTS

| | | |
|---|---|---|
| CN | 1380702 A | 11/2002 |
| CN | 101051665 | 10/2007 |

(Continued)

*Primary Examiner* — Hoan C Nguyen
(74) *Attorney, Agent, or Firm* — Han IP Corporation (57) ABSTRACT

A circuit substrate including a base layer and a plurality of lead units arranged as an array is provided, wherein the base layer has a plurality of through grooves, and the lead units are disposed on the base layer. Each of the lead units includes a common terminal and at least three leads. The common terminal is capable of being divided into a plurality of electrodes connected with each other. The leads are extended outwards from the edge of the common terminal, and each of the leads is extended outwards from the edge of one of the electrodes. The through grooves expose the common terminals of the lead units.

16 Claims, 7 Drawing Sheets

(56) References Cited

U.S. PATENT DOCUMENTS

| | | |
|---|---|---|
| 7,192,163 B2 | 3/2007 | Park |
| 7,579,628 B2 * | 8/2009 | Inoguchi ..................... 257/81 |
| 7,642,563 B2 * | 1/2010 | Kang et al. .................. 257/99 |
| 7,938,558 B2 | 5/2011 | Wilcox et al. |
| 2004/0099874 A1 * | 5/2004 | Chang et al. ................ 257/98 |
| 2004/0180459 A1 * | 9/2004 | Hsu ............................. 438/26 |
| 2006/0091416 A1 * | 5/2006 | Yan .............................. 257/99 |
| 2007/0216274 A1 | 9/2007 | Schultz et al. |
| 2007/0235743 A1 * | 10/2007 | Lee et al. ..................... 257/81 |
| 2007/0241361 A1 * | 10/2007 | Oishi et al. .................. 257/99 |
| 2007/0246715 A1 * | 10/2007 | Shin et al. ................... 257/79 |
| 2008/0017871 A1 | 1/2008 | Lee et al. |
| 2009/0227050 A1 | 9/2009 | Shin et al. |

FOREIGN PATENT DOCUMENTS

| | | |
|---|---|---|
| EP | 1594171 A2 | 9/2005 |
| TW | 200802975 | 1/2008 |
| TW | M328674 | 3/2008 |

* cited by examiner

CIRCUIT SUBSTRATE AND LIGHT EMITTING DIODE PACKAGE

CROSS-REFERENCE TO RELATED PATENT APPLICATIONS

This application is a divisional application of and claims the priority benefit of U.S. patent application Ser. No. 12/369,729, filed Feb. 11, 2009, which claims the priority benefit of Taiwan Patent Application Serial No. 97117902, filed May 15, 2008. These patent applications are herein incorporated in their entirety by reference.

BACKGROUND

1. Technical Field

The present disclosure generally relates to a circuit substrate and a light emitting diode (LED) package, and more particularly, to a circuit substrate and a LED package having low manufacture cost.

2. Description of Related Art

Compared to the conventional light bulbs, light emitting diode (LED) has smaller volume, longer lifespan, lower energy consumption, and less contamination. Thus, LED has gradually replaced fluorescent lamp and incandescent lamp in some fields along with the advancement in the illumination efficiency thereof. For example, LED has been broadly applied to the light source of scanner which requires quick response, the backlight source of liquid crystal display (LCD), the light source of vehicle instrument panel, the light source of traffic light, and some other illuminating apparatuses.

Figure 1:
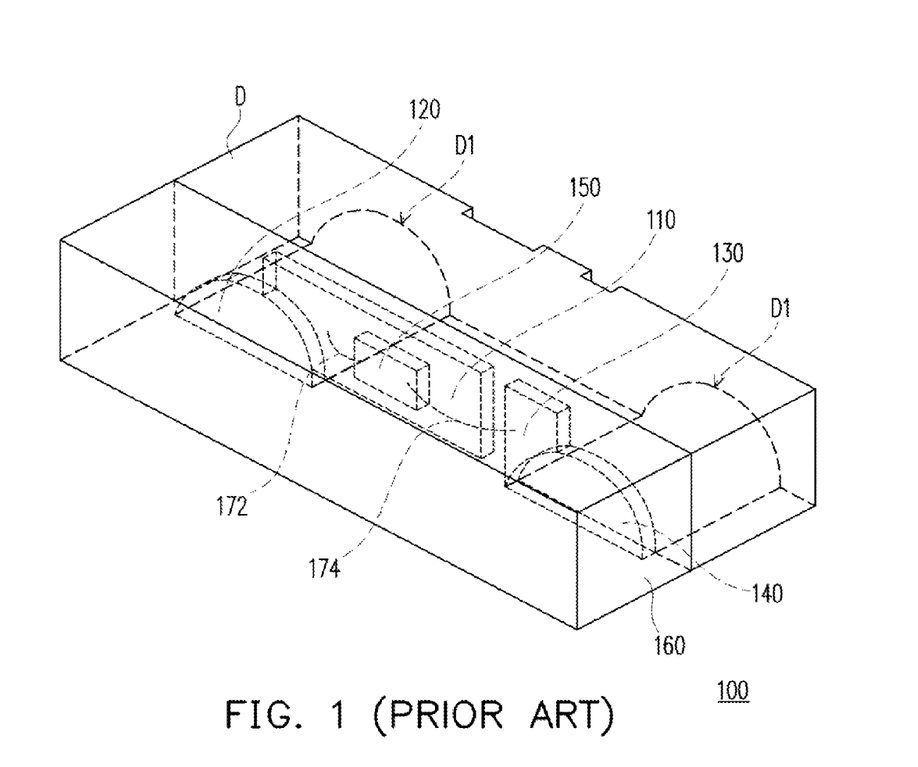
FIG. 1 is a perspective diagram of a conventional light emitting diode (LED) package.
Figure 2:
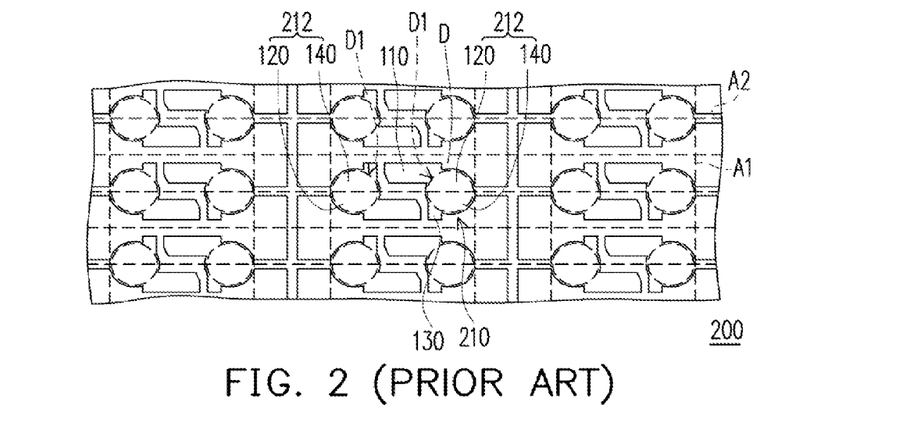
FIG. 2 is a diagram of a conventional circuit substrate, and the circuit substrate in FIG. 2 is divided into a plurality of first leads, first electrodes, second leads, and second electrodes as shown in FIG. 1.

FIG. 1 is a perspective diagram of a conventional LED package. FIG. 2 is a diagram of a conventional circuit substrate, and the circuit substrate in FIG. 2 is cut to provide a plurality of first leads, first electrodes, second leads, and second electrodes as shown in FIG. 1.

Referring to FIG. 1, the LED package 100 includes a substrate D, a first lead 110, a first electrode 120, a second lead 130, a second electrode 140, a LED chip 150, and an encapsulant 160. The first lead 110, the first electrode 120, the second lead 130, and the second electrode 140 are disposed on the substrate D.

The first lead 110 is connected to the first electrode 120, and the second lead 130 is connected to the second electrode 140. The LED chip 150 is disposed on the first lead 110 and is electrically connected to the first lead 110 and the second lead 130 respectively through a first bonding wire 172 and a second bonding wire 174. The encapsulant 160 is disposed on the substrate D and covers the first lead 110, the second lead 130, and the LED chip 150. The substrate D has two through hole D1 respectively exposing the first electrode 120 and the second electrode 140, and the LED package 100 can be electrically connected to other electronic devices (for example, a circuit board) through the first electrode 120 and the second electrode 140.

Referring to FIG. 2, the circuit substrate 200 can be divided into a plurality of carriers along a plurality of cutting paths A1 and a plurality of cutting paths A2. The circuit substrate 200 has a plurality of lead units 210. Each carrier has a substrate D, a first lead 110, a first electrode 120, a second lead 130, and a second electrode 140 (as shown in FIG. 1). Each of the lead units 210 has a first lead 110, a second lead 130, and a common terminal 212, and the common terminal 212 is composed of a first electrode 120 and a second electrode 140. The first lead 110 and the second lead 130 of each of the lead units 210 are respectively connected to the edge of the first electrode 120 and the edge of the second electrode 140. Each of the lead units 210 can be cut into two conductive structures, wherein the conductive structures may be the first lead 110 and the first electrode 120 or the second lead 130 and the second electrode 140.

Conventionally, a substrate (not shown) entirely covered by a metal layer is usually provided and the metal layer is patterned to form the circuit substrate 200. However, the lead units 210 on the circuit substrate 200 have low layout density, and each lead unit 210 can be cut into only two conductive structures. In other words, the amount of conductive structures fabricated on a unit area of substrate is small. Accordingly, the manufacture cost of the conductive structures is high.

SUMMARY

Accordingly, the present disclosure is directed to a circuit substrate, wherein lead units of the circuit substrate are arranged densely and each of the lead units can be cut into more conductive structures.

The present disclosure is directed to a light emitting diode (LED) package having lower manufacture cost.

The present disclosure provides a circuit substrate including a base layer and a plurality of lead units arranged as an array, wherein the base layer has a plurality of through grooves, and the lead units are disposed on the base layer. Each of the lead units includes a common terminal and at least three leads. The common terminal is divided into a plurality of electrodes connected with each other. The leads are extended outwards from the edge of the common terminal, and each of the leads is extended outwards from the edge of one of the electrodes. The through grooves respectively expose the common terminals of the lead units.

According to an embodiment of the present disclosure, each of the lead units has four leads.

According to an embodiment of the present disclosure, the patterns of the lead units are substantially the same.

According to an embodiment of the present disclosure, the pattern of each of the lead units is substantially a point symmetric pattern, the leads in each of the lead units include two first leads and two second leads, and the pattern of each of the first leads is different from the pattern of each of the second leads.

According to an embodiment of the present disclosure, each of the first leads has a chip carrying portion, and each of the second leads does not have a chip carrying portion.

According to an embodiment of the present disclosure, each of the first leads further includes a wire bonding portion, and each of the first leads has at least one flush proof notch located between the chip carrying portion and the wire bonding portion.

According to an embodiment of the present disclosure, each of the first leads further includes a wire bonding portion, and each of the first leads has a flush proof opening located between the chip carrying portion and the wire bonding portion.

According to an embodiment of the present disclosure, each of the point symmetric patterns is symmetrical with a central point of each common terminal as its symmetric center.

According to an embodiment of the present disclosure, the pattern of each of the lead units is substantially a line symmetric pattern, the leads in each of the lead units include two first leads and two second leads, and the pattern of each of the first leads is different from the pattern of each of the second leads.

According to an embodiment of the present disclosure, each of the first leads has a chip carrying portion, and each of the second leads does not have a chip carrying portion.

According to an embodiment of the present disclosure, each of the first leads further has a wire bonding portion, and each of the first leads has at least one flush proof notch located between the chip carrying portion and the wire bonding portion.

According to an embodiment of the present disclosure, each of the first leads further has a wire bonding portion, and each of the first leads has a flush proof opening located between the chip carrying portion and the wire bonding portion.

According to an embodiment of the present disclosure, each of the line symmetric patterns is symmetrical along a symmetric axis, and the symmetric axis is parallel to the row direction and passes through a central point of each common terminal.

According to an embodiment of the present disclosure, the lead units arranged in the same row include a plurality of first lead units and a plurality of second lead units, each of the first lead units has a first pattern, each of the second lead units has a second pattern, and the first pattern is different from the second pattern, wherein the first lead units and the second lead units are arranged alternatively along the row direction.

According to an embodiment of the present disclosure, the pattern of each of the first lead units and each of the second lead units is substantially a line symmetric pattern, the leads in each of the first lead units include two first leads and two second leads, the leads in each of the second lead units include two first leads and two second leads, and the pattern of each of the first leads is different from the pattern of each of the second leads.

According to an embodiment of the present disclosure, each of the first leads has a chip carrying portion, and each of the second leads does not have a chip carrying portion.

According to an embodiment of the present disclosure, each of the first leads further has a wire bonding portion, and each of the first leads has at least one flush proof notch located between the chip carrying portion and the wire bonding portion.

According to an embodiment of the present disclosure, each of the first leads further has a wire bonding portion, and each of the first leads has a flush proof opening located between the chip carrying portion and the wire bonding portion.

According to an embodiment of the present disclosure, each of the line symmetric patterns is symmetrical along a symmetric axis, and the symmetric axis is parallel to the column direction and passes through a central point of each common terminal.

According to an embodiment of the present disclosure, the pattern of each of the first lead units is substantially identical to the pattern of each of the second lead units after the pattern of the first lead unit is rotated 180°.

According to an embodiment of the present disclosure, the pattern of each of the first lead units and each of the second lead units is substantially a point symmetric pattern, the leads in each of the first lead units include four first leads, the leads in each of the second lead units include four second leads, and the pattern of each of the first leads is different from the pattern of each of the second leads.

According to an embodiment of the present disclosure, each of the first leads has a chip carrying portion, and each of the second leads does not have a chip carrying portion.

According to an embodiment of the present disclosure, each of the first leads further has a wire bonding portion, and each of the first leads has at least one flush proof notch located between the chip carrying portion and the wire bonding portion.

According to an embodiment of the present disclosure, each of the first leads further has a wire bonding portion, and each of the first leads has a flush proof opening located between the chip carrying portion and the wire bonding portion.

According to an embodiment of the present disclosure, each of the lead units has three leads.

According to an embodiment of the present disclosure, the lead units arranged in the same row include a plurality of first lead units and a plurality of second lead units, each of the first lead units has a first pattern, and each of the second lead units has a second pattern, and the first pattern is different from the second pattern, wherein the first lead units and the second lead units are arranged alternatively along the row direction.

According to an embodiment of the present disclosure, each of the first lead units includes a first lead and two second leads, each of the second lead units includes two first leads and a second lead, and the pattern of each of the first leads is different from the pattern of each of the second leads.

According to an embodiment of the present disclosure, each of the first lead units includes three first leads, each of the second lead units includes three second leads, and the pattern of each of the first leads is different from the pattern of each of the second leads.

According to an embodiment of the present disclosure, each of the first leads has a chip carrying portion, and each of the second leads does not have a chip carrying portion.

According to an embodiment of the present disclosure, each of the first leads further has a wire bonding portion, and each of the first leads has at least one flush proof notch located between the chip carrying portion and the wire bonding portion.

According to an embodiment of the present disclosure, each of the first leads further has a wire bonding portion, and each of the first leads has a flush proof opening located between the chip carrying portion and the wire bonding portion.

The present disclosure provides a LED package including a carrier, a LED chip, and an encapsulant. The carrier includes a substrate, a first electrode, a first lead, a second electrode, and a second lead. The first electrode, the first lead, the second electrode, and the second lead are all disposed on the substrate, and the substrate has two through grooves respectively exposing the first electrode and the second electrode. The first lead is connected to the edge of the first electrode. The second lead is connected to the edge of the second electrode. The LED chip is disposed on the first lead and is electrically connected to the first lead and the second lead. The encapsulant is disposed on the substrate and covers the first lead, the second lead, and the LED chip, wherein the encapsulant has two through grooves respectively exposing the first electrode and the second electrode. Each of the first electrode and the second electrode has two adjacent cutting edges which are located at a corner and are not parallel to each other.

According to an embodiment of the present disclosure, the two cutting edges of the first electrode form an angle of about 90°, and the two cutting edges of the second electrode form an angle of about 90°.

According to an embodiment of the present disclosure, the two cutting edges of the first electrode and the two cutting edges of the second electrode are all aligned with the edges of the encapsulant.

According to an embodiment of the present disclosure, the first lead has a chip carrying portion and a wire bonding portion, and the LED chip is disposed on the chip carrying portion and is electrically connected to the wire bonding portion.

According to an embodiment of the present disclosure, the first lead has at least one flush proof notch located between the chip carrying portion and the wire bonding portion.

According to an embodiment of the present disclosure, the first lead has a flush proof opening located between the chip carrying portion and the wire bonding portion.

According to an embodiment of the present disclosure, the material of the encapsulant includes a transparent encapsulant.

As described above, in the present disclosure, the lead units are arranged in a high density and each of the lead units can be divided into at least three conductive structures. Thus, more lead units can be fabricated on a unit area of substrate and each lead unit can be divided into more conductive structures. In other words, more conductive structures can be fabricated on a unit area of substrate. Thereby, the manufacture cost of conductive structures is reduced in the present disclosure.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF THE PREFERRED EMBODIMENTS

Reference will now be made in detail to the present preferred embodiments of the disclosure, examples of which are illustrated in the accompanying drawings. Wherever possible, the same reference numbers are used in the drawings and the description to refer to the same or like parts.

Figure 3A:
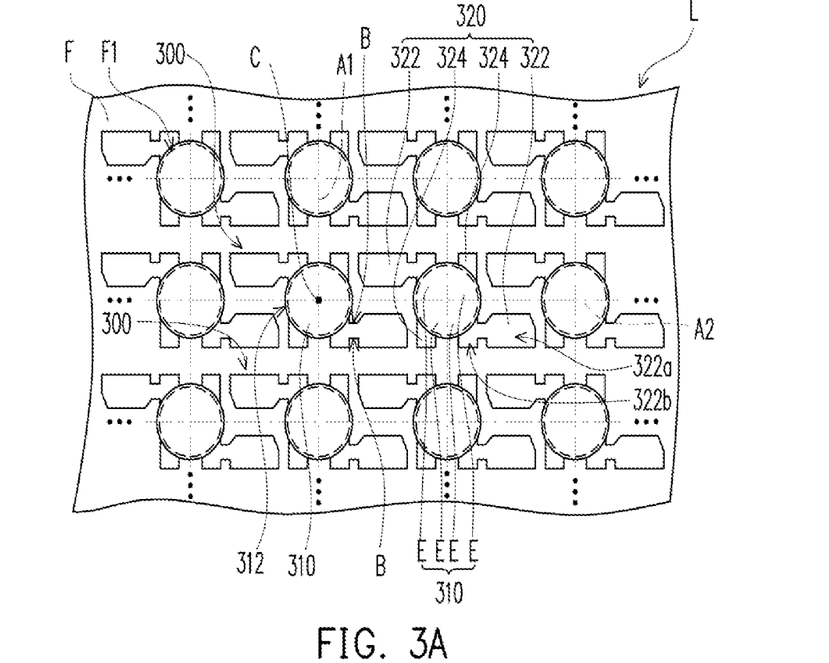
FIG. 3A and FIG. 3B are diagrams of a circuit substrate according to an embodiment of the present disclosure.
Figure 3B:
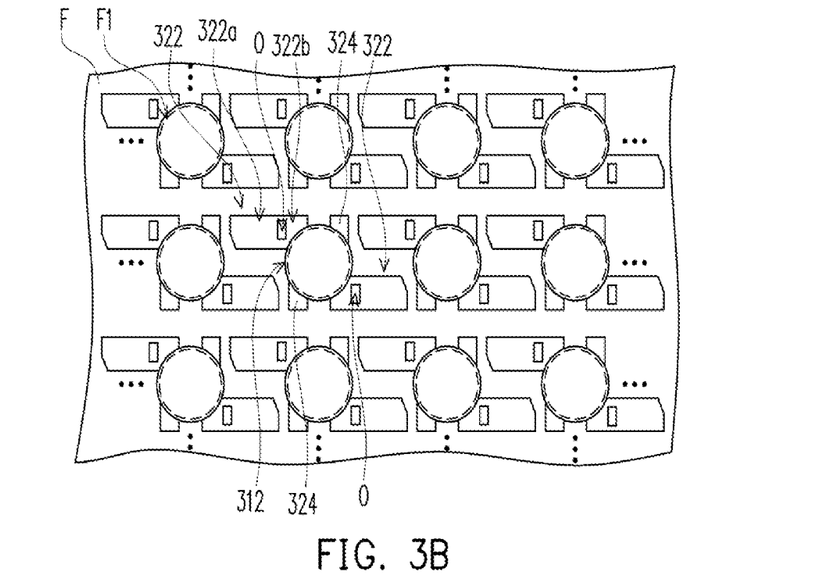

FIG. 3A and FIG. 3B are diagrams of a circuit substrate according to an embodiment of the present disclosure, and FIGS. 4~11 illustrate different variations of the circuit substrate in FIG. 3A.

Referring to FIG. 3A, in the present embodiment, the circuit substrate L includes a base layer F and a plurality of lead units 300 arranged as an array, wherein the lead units 300 are all disposed on the base layer F and arranged into multiple rows and multiple columns on the base layer F. The base layer F has a plurality of through holes F1. Each of the lead units 300 includes a common terminal 310 and at least three leads 320. In the present embodiment, each of the lead units 300 has four leads 320. The common terminal 310 is divided into a plurality of electrodes E connected with each other. The leads 320 are extended outwards from the edge of the common terminal 310, and each of the leads 320 is extended outwards from the edge of one of the electrodes E. The through holes F1 of the base layer F respectively expose the common terminals 310 of the lead units 300.

In FIG. 3A, a plurality of cutting paths A1 and A2 are illustrated as the cutting paths for subsequently cutting the circuit substrate L. As shown in FIG. 3A, each lead unit 300 of the circuit substrate L can be divided into four conductive structures by one of the cutting paths A1 and one of the cutting paths A2, wherein each of the conductive structures is composed of an electrode E and a lead 320 connected to the electrode E.

It should be noted that compared to the conventional technique, the lead units 300 in the present embodiment are arranged in a higher density, and each of the lead units 300 can be divided into at least three conductive structures. Thus, more lead units can be fabricated on a unit area of substrate, and each lead unit can be divided into more conductive structures. In other words, more conductive structures can be fabricated from a unit area of substrate. Accordingly, the fabrication cost of conductive structures is reduced in the present embodiment.

In the present embodiment, the lead units 300 have substantially the same pattern. The pattern of each of the lead units 300 is substantially a point symmetric pattern, and the four leads 320 of each lead unit 300 can be categorized into two first leads 322 and two second leads 324, wherein the pattern of each first lead 322 is different from the pattern of each second lead 324. For example, each of the first leads 322 has a chip carrying portion 322a, and each of the second leads 324 does not have a chip carrying portion 322a. Moreover, each of the point symmetric patterns may take a central point C of each common terminal 310 as its symmetric center. In the present embodiment, the first leads 322 and the second leads 324 of each lead unit 300 may be arranged alternatively along the edge 312 of the common terminal 310. In other words, one of the first leads 322 may be located between two second leads 324, and one of the second leads 324 may be located between two first leads 322; however, the present disclosure is not limited to foregoing arrangement.

Additionally, each of the first leads 322 may further have a wire bonding portion 322b which is suitable for being wire bonded with a chip (not shown) subsequently disposed on the chip carrying portion 322a. Moreover, in order to prevent the resin for subsequently bonding the chip and the chip carrying portion 322a from flowing into the wire bonding portion 322b and accordingly affecting the yield of the wire bonding process. In the present embodiment, at least one flush proof notch B (two are demonstratively illustrated in FIG. 3A) is formed between the chip carrying portion 322a and the wire bonding portion 322b of the first lead 322. Thus, the resin may flow into the flush proof notch B but not into the wire bonding portion 322b. Besides, referring to FIG. 3B, a flush proof opening O may be further formed between the chip carrying portion 322a and the wire bonding portion 322b of the first lead 322 in order to prevent the resin from overflowing.

Below, variations of the circuit substrate in FIG. 3A will be further described in detail.

Figure 4:
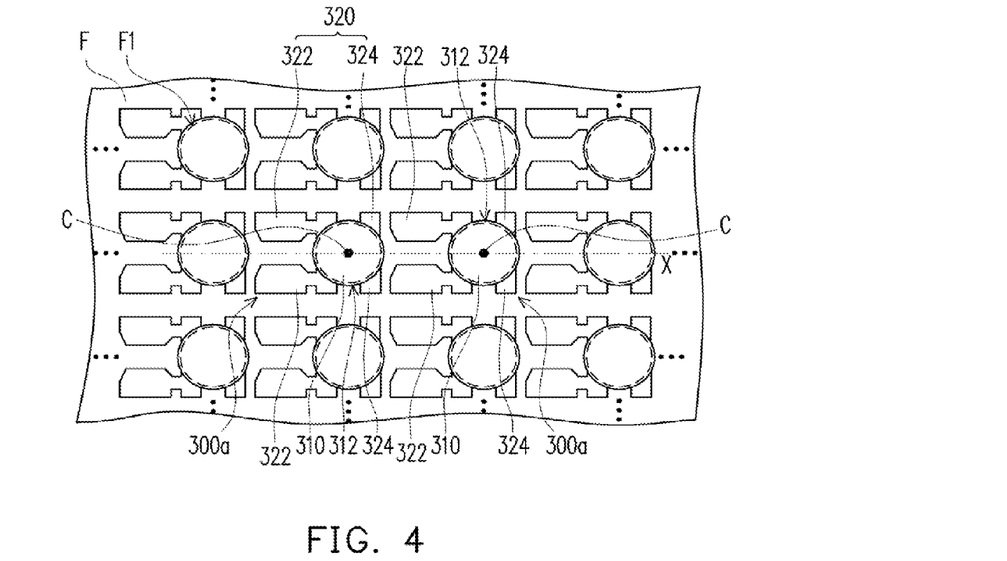
FIGS. 4~11 illustrate different variations of the circuit substrate in FIG. 3A.

Referring to FIG. 4, in the present embodiment, the pattern of each of the lead units 300a is substantially a line symmetric pattern, and the leads 320 in each of the lead units 300a include two first leads 322 and two second leads 324. Besides, in the present embodiment, each of the line symmetric patterns is symmetrical along a symmetric axis X, and the symmetric axis X is parallel to the row direction and passes through the central point C of each common terminal 310. In the present embodiment, the two first leads 322 of each lead unit 300a are arranged adjacently along the edge 312 of the common terminal 310 and are both located at the left side of the common terminal 310, and the two second leads 324 are arranged adjacently along the edge 312 of the common terminal 310 and are both located at the right side of the common terminal 310; however, the present disclosure is not limited to foregoing arrangement.

It should be noted that in following embodiments illustrated in FIGS. 5~11, the lead units arranged in the same row include a plurality of first lead units and a plurality of second lead units, each of the first lead units has a first pattern, each of the second lead units has a second pattern, and the first pattern is different from the second pattern. The first lead units and the second lead units may be arranged alternatively along the row direction. Besides, in the present embodiment, FIGS. 5~11 illustrate a plurality of first lead units and second lead units arranged as an array, wherein the lead units arranged in the same column may all be the first lead units or the second lead units. However, in other embodiments of the present disclosure, the first lead units and the second lead units may also be arranged alternatively along the row direction, and the first lead units and the second lead units may be arranged alternatively along the column direction.

Figure 5:
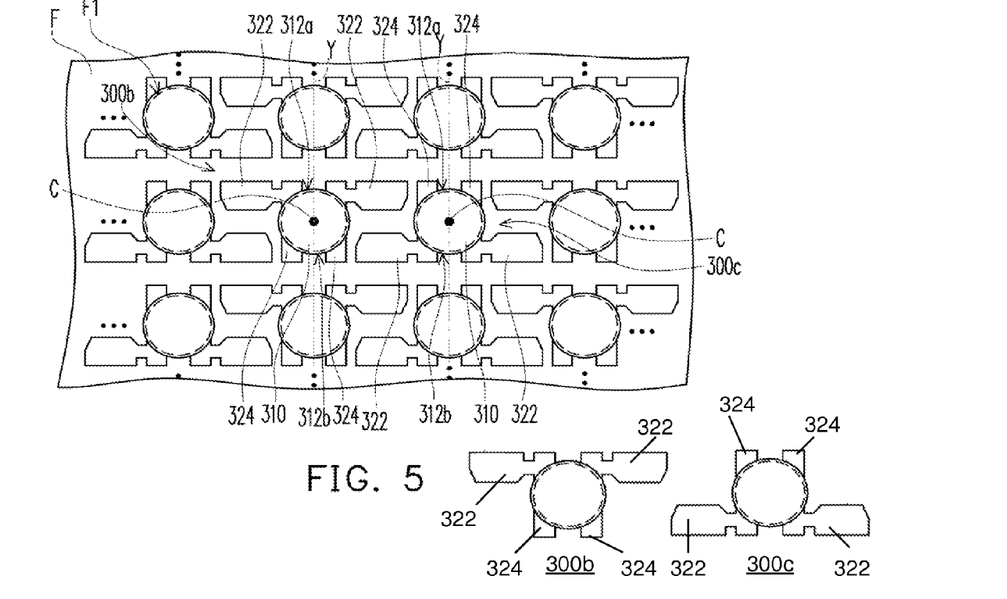

Referring to FIG. 5, in the present embodiment, the pattern of each first lead unit 300b and each second lead unit 300c is substantially a line symmetric pattern. In addition, each of the line symmetric patterns may be symmetrical along a symmetric axis Y, and the symmetric axis Y is parallel to the column direction and passes through a central point C of each common terminal 310. Besides, in the present embodiment, the pattern of each first lead unit 300b is substantially identical to the pattern of each second lead unit 300c after the pattern of the first lead unit 300b is rotated 180°.

The leads in each of the first lead units 300b include two first leads 322 and two second leads 324, and the leads in each of the second lead units 300c include two first leads 322 and two second leads 324. To be specific, the two first leads 322 of each first lead unit 300b are arranged adjacently along the upper edge 312a of the common terminal 310 and are respectively located at both sides of the common terminal 310, the two second leads 324 thereof are arranged adjacently along the lower edge 312b of the common terminal 310 and are respectively located at both sides of the common terminal 310. Moreover, the two first leads 322 of each second lead unit 300c are arranged adjacently along the lower edge 312b of the common terminal 310 and are respectively located at both sides of the common terminal 310, and the two second leads 324 thereof are arranged adjacently along the upper edge 312a of the common terminal 310 and are respectively located at both sides of the common terminal 310. It should be noted that foregoing arrangement of the first leads 322 and the second leads 324 of each of the first lead units 300b and each of the second lead units 300c is only an example but not for limiting the present disclosure.

Figure 6:
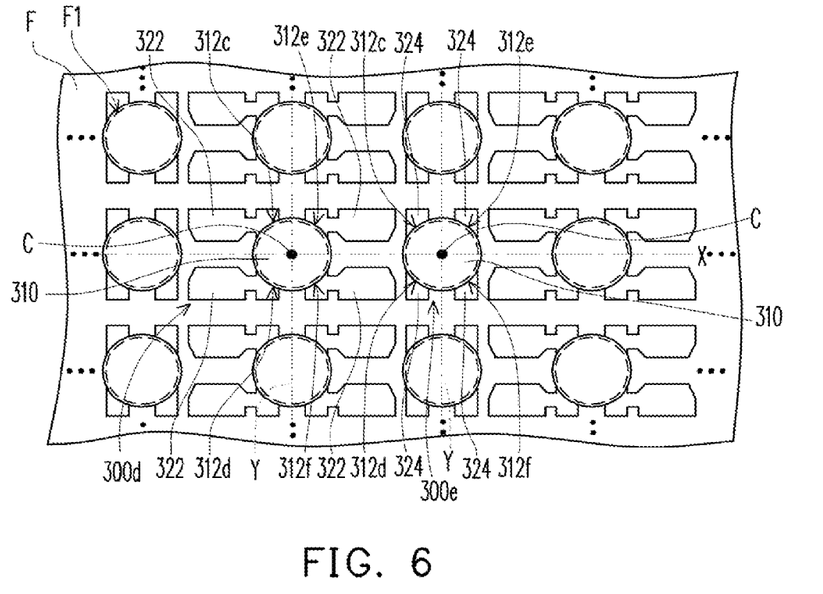

Referring to FIG. 6, in the present embodiment, the pattern of each of the first lead units 300d and each of the second lead units 300e is substantially a point symmetric pattern. The leads in each of the first lead units 300d may have four first leads 322, and the leads in each of the second lead units 300e may have four second leads 324. To be specific, the four first leads 322 in each of the first lead units 300d are respectively connected to the upper left edge 312c, the lower left edge 312d, the upper right edge 312e, and the lower right edge 312f of the common terminal 310. Similarly, the four second leads 324 of each of the second lead units 300e are respectively connected to the upper left edge 312c, the lower left edge 312d, the upper right edge 312e, and the lower right edge 312f of the common terminal 310. It should be noted that foregoing arrangement of the first leads 322 and the second leads 324 of each of the first lead units 300d and each of the second lead units 300e is only an example but not for limiting the present disclosure.

Additionally, the pattern of each of the first lead units 300d and each of the second lead units 300e illustrated in FIG. 6 may also be a line symmetric pattern, and the line symmetric pattern has two symmetric axes X and Y, wherein the symmetric axis X is parallel to the row direction, the symmetric axis Y is parallel to the column direction, and both the symmetric axes X and Y pass through the central point C of each common terminal 310; however, foregoing description is only an example but not for limiting the present disclosure.

It should be mentioned that in following embodiments illustrated in FIGS. 7~10, each of the lead units has three leads. Moreover, each of the first lead units includes a first lead and two second leads, and each of the second lead units includes two first leads and a second lead. In the embodiments illustrated in FIGS. 7~10, different arrangements of the first leads and the second leads in each of the first lead units and each of the second lead units are described; however, the present disclosure is not limited to these arrangements, and those skilled in the art should be able to make various changes thereto.

Figure 7:
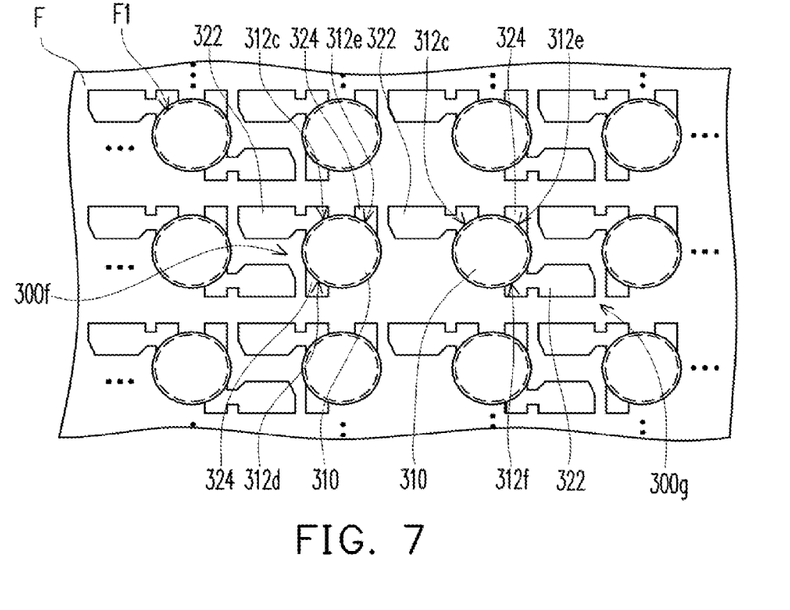

Referring to FIG. 7, in the present embodiment, the first lead 322 and the second leads 324 of each first lead unit 300f are respectively connected to the upper left edge 312c, the lower left edge 312d, and the upper right edge 312e of the common terminal 310, and the first leads 322 and the second lead 324 of each second lead unit 300g are respectively connected to the upper left edge 312c, the lower right edge 312f, and the upper right edge 312e of the common terminal 310.

Figure 8:
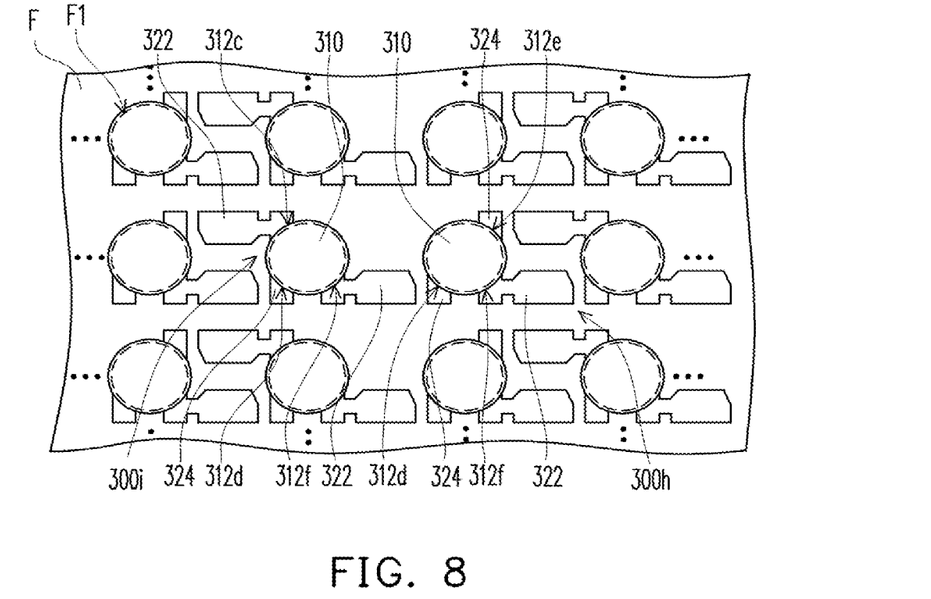

Referring to FIG. 8, in the present embodiment, the first lead 322 and the second leads 324 of each first lead unit 300h are respectively connected to the lower right edge 312f, the upper right edge 312e, and the lower left edge 312d of the common terminal 310, and the first leads 322 and the second lead 324 of each second lead unit 300i are respectively connected to the upper left edge 312c, the lower right edge 312f, and the lower left edge 312d of the common terminal 310.

Figure 9:
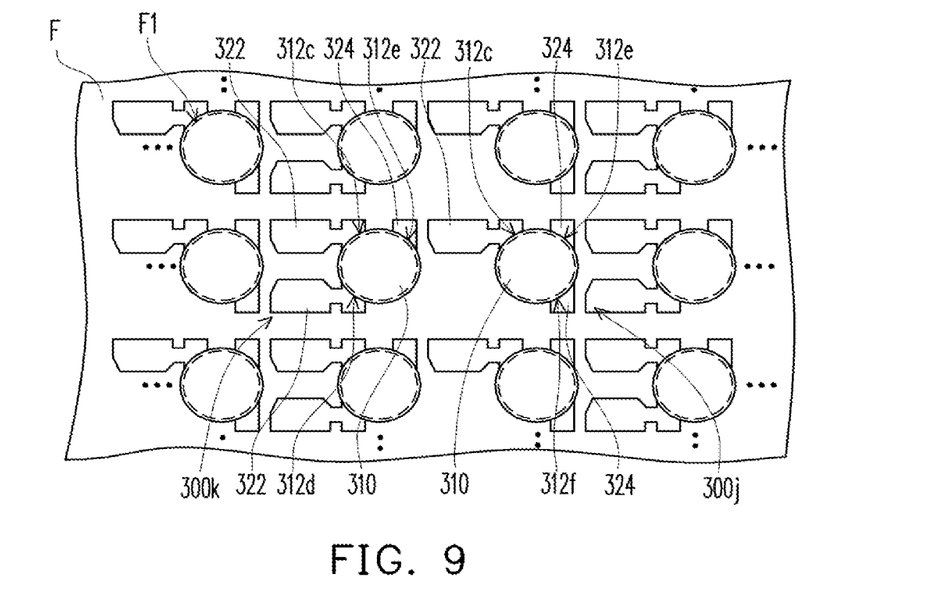

Referring to FIG. 9, in the present embodiment, the first lead 322 and the second leads 324 of each first lead unit 300j are respectively connected to the upper left edge 312c, the upper right edge 312e, and the lower right edge 312f of the common terminal 310, and the first leads 322 and the second lead 324 of each second lead unit 300k are respectively connected to the upper left edge 312c, the lower left edge 312d, and the upper right edge 312e of the common terminal 310.

Figure 10:
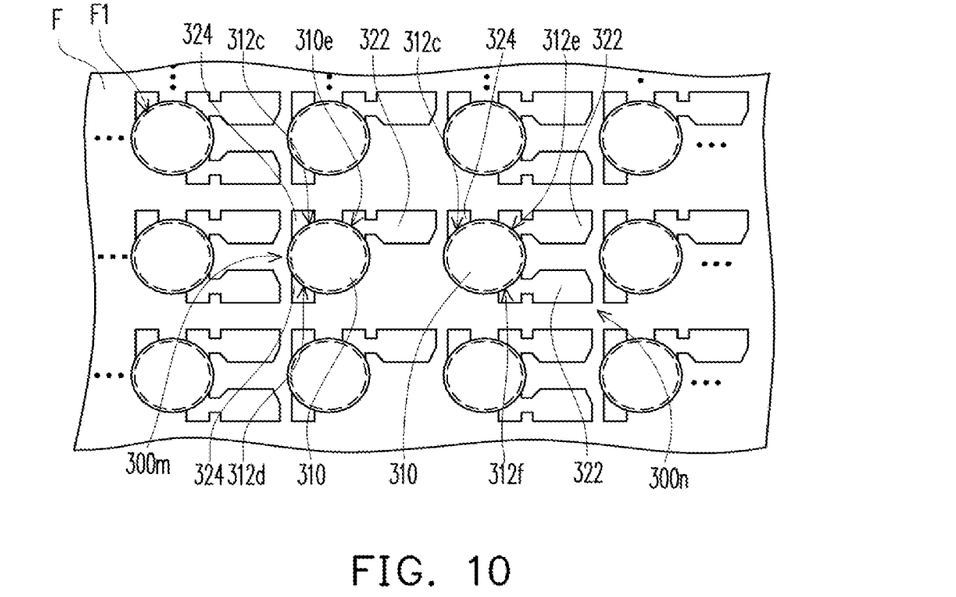

Referring to FIG. 10, in the present embodiment, the first lead 322 and the second leads 324 of each first lead unit 300m are respectively connected to the upper right edge 312e, the upper left edge 312c, and the lower left edge 312d of the common terminal 310, and the first leads 322 and the second lead 324 of each second lead unit 300n are respectively connected to the upper right edge 312e, the lower right edge 312f, and the upper left edge 312c of the common terminal 310.

Figure 11:
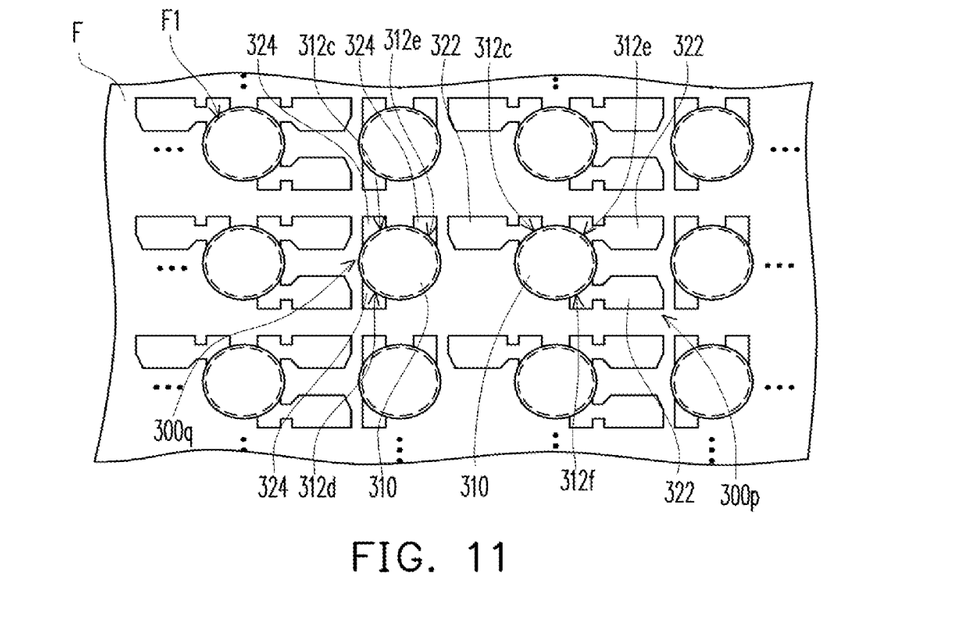

Referring to FIG. 11, in the present embodiment, each lead unit has three leads, wherein each of the first lead units 300p includes three first leads 322, and each of the second lead units 300q includes three second leads 324. For example, the first leads 322 in each of the first lead units 300p are respectively connected to the upper left edge 312c, the upper right edge 312e, and the lower right edge 312f of the common terminal 310, and the second leads 324 in each of the second lead units 300q are respectively connected to the upper left edge 312c, the lower left edge 312d, and the upper right edge 312e of the common terminal 310.

A LED package fabricated from the circuit substrate illustrated in FIG. 3A or FIGS. 4~11 will be described in detail below.

Figure 12A:
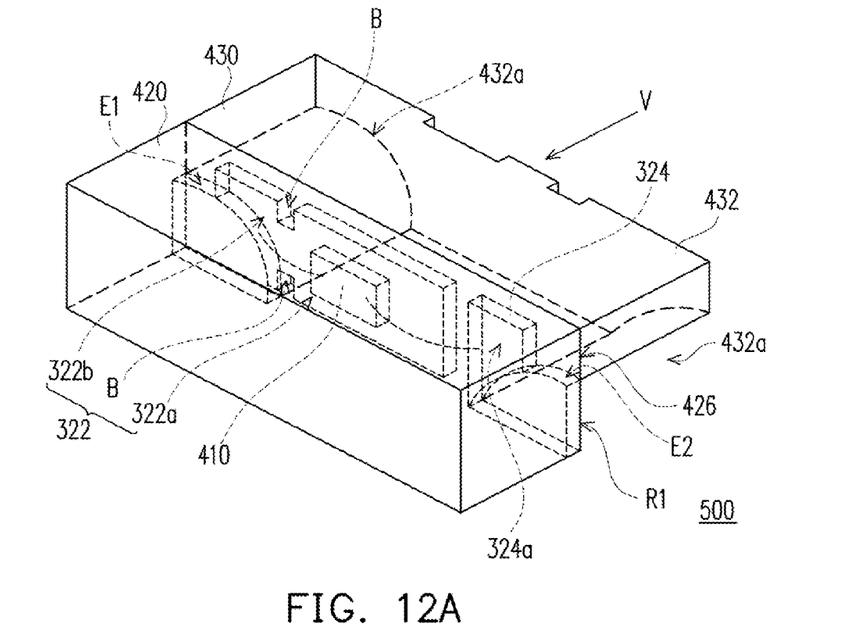
FIG. 12A is a perspective diagram of a LED package according to an embodiment of the present disclosure.
Figure 12B:
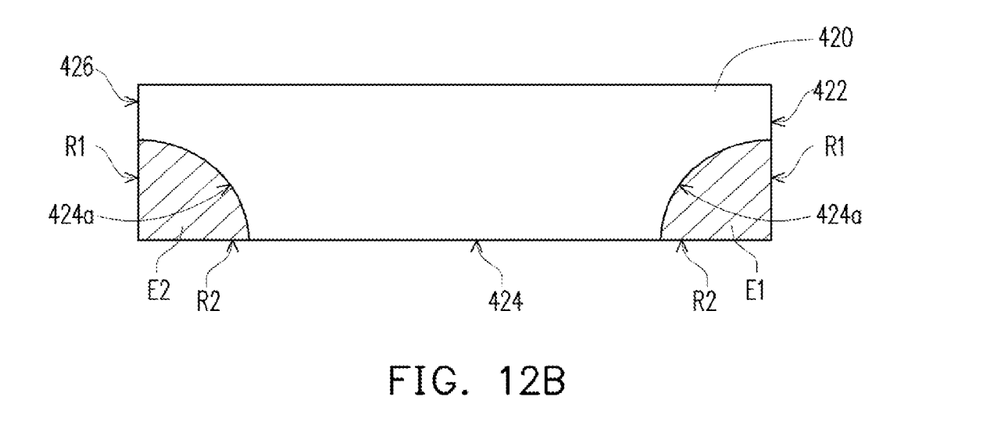
FIG. 12B is a side view of the LED package in FIG. 12A from the direction denoted by the arrow V.

FIG. 12A is a perspective diagram of a LED package according to an embodiment of the present disclosure, and FIG. 12B is a side view of the LED package in FIG. 12A from the direction denoted by the arrow V.

Referring to both FIG. 12A and FIG. 12B, in the present embodiment, the LED package 500 includes a LED chip 410, an encapsulant 420, and a carrier 430, wherein the carrier 430 includes a substrate 432, a first electrode E1, a first lead 322, a second electrode E2, and a second lead 324. The first electrode E1, the first lead 322, the second electrode E2, and the second lead 324 are all disposed on the substrate 432, and the substrate 432 has two through grooves 432a respectively exposing the first electrode E1 and the second electrode E2.

The first lead 322 is connected to the edge of the first electrode E1, and the second lead 324 is connected to the edge of the second electrode E2. In the present embodiment, the first lead 322 and the first electrode E1 may be formed integrally, and the second lead 324 and the second electrode E2 may be formed integrally. The first lead 322 may have a chip carrying portion 322a and a wire bonding portion 322b, and the second lead 324 may also have a wire bonding portion 324a. The LED chip 410 is disposed on the chip carrying portion 322a and is electrically connected to the two wire bonding portions 322b and 324a respectively. The encapsulant 420 is disposed on the substrate 432 and covers the first lead 322, the second lead 324, and the LED chip 410. The material of the encapsulant 420 may be a transparent encapsulant or other suitable transparent materials.

In the present embodiment, in order to prevent the resin for bonding the LED chip 410 and the chip carrying portion 322a from flowing into the wire bonding portion 322b, the first lead 322 may further have at least one flush proof notch B located between the chip carrying portion 322a and the wire bonding portion 322b. In another embodiment of the present disclosure, each of the first leads 322 may have a flush proof opening (not shown) located between the chip carrying portion 322a and the wire bonding portion 322b.

It should be noted that in the present embodiment, the first electrode E1 is one of four electrodes E obtained by cutting a common terminal 310 in FIG. 3A along a cutting path A1 and a cutting path A2. Similarly, the second electrode E2 is also one of four electrodes E obtained by cutting another common terminal 310 along another cutting path A1 and the same cutting path A2. Thus, the surface areas of the first electrode E1 and second electrode E2 in the present embodiment are respectively smaller than the surface areas of the first electrode 120 and second electrode 140 in the conventional technique (referring to FIG. 1). Accordingly, the volume of the LED package 500 in the present embodiment is smaller than that of the conventional LED package 100.

Each of the first electrode E1 and the second electrode E2 has two adjacent cutting edges R1 and R2 which are located at a corner of the encapsulant 420 and are not parallel to each other. In the present embodiment, the two cutting edges R1 and R2 of the first electrode E1 form an angle of about 90°, and the two cutting edges R1 and R2 of the second electrode E2 form an angle of about 90°. However, in another embodiment of the present disclosure, the two cutting edges R1 and R2 of the first electrode E1 and the second electrode E2 may also form angles of different degrees.

Additionally, the two cutting edges R1 and R2 of the first electrode E1 and the two cutting edges R1 and R2 of the second electrode E2 are all aligned with the edges of the encapsulant 420. For example, the cutting edges R1 and R2 of the first electrode E1 are respectively aligned with the edges 422 and 424 of the encapsulant 420, and the cutting edges R1 and R2 of the second electrode E2 are respectively aligned with the edges 426 and 424 of the encapsulant 420.

In overview, in the present disclosure, the lead units are arranged in a high density and each of the lead units can be divided into at least three conductive structures. Accordingly, more lead units can be fabricated on a unit area of substrate, and each lead unit can be divided into more conductive structures. In other words, more conductive structures can be fabricated from a unit area of substrate. Thereby, the manufacture cost of conductive structures is reduced in the present disclosure. Moreover, in the present disclosure, a flush proof notch or a flush proof opening is further disposed between the chip carrying portion and wire bonding portion of each first lead such that the resin for bonding a chip and the chip carrying portion is prevented from flowing into the wire bonding portion and accordingly the yield of the wire bonding process is ensured. Furthermore, in the present disclosure, the first electrode and the second electrode of a LED package have smaller surface area. Accordingly, the volume of the LED package is reduced.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims and their equivalents.

What is claimed is:

1. A circuit substrate, comprising: a base layer, having a plurality of through grooves; and a plurality of lead units of light-emitting diode (LED), arranged as an array and disposed on the base layer, wherein each of the lead units comprises: a common terminal, divided into a plurality of electrodes, wherein the electrodes are connected with each other; and four leads, extended from and in direct contact with an edge of the common terminal, wherein each of the leads is respectively extended from an edge of a respective one of the electrodes and not in contact with any other of the leads, and wherein the through grooves expose the common terminal of the lead units, wherein a pattern of each of the lead units is substantially a point asymmetric pattern with respect to a center point of the common terminal, wherein the four leads comprise a pair of first leads and a pair of second leads with a shape and size of the first leads different from a shape and size of the second leads, and wherein the lead units arranged in a same row comprise a plurality of first lead units and a plurality of second lead units.

2. The circuit substrate according to claim 1, wherein each of the first leads has a chip carrying portion, and each of the second leads does not have a chip carrying portion.

3. The circuit substrate according to claim 2, wherein each of the first leads has a wire bonding portion, and each of the first leads has at least one flush proof notch located between the chip carrying portion and the wire bonding portion.

4. The circuit substrate according to claim 2, wherein each of the first leads has a wire bonding portion, and each of the first leads has a flush proof opening located between the chip carrying portion and the wire bonding portion.

5. The circuit substrate according to claim 1, wherein each of the first lead units has a first pattern and each of the second lead units has a second pattern, wherein the first pattern is different from the second pattern, and wherein the first lead units and the second lead units are arranged alternatively along a row direction.

6. The circuit substrate according to claim 5, wherein the pattern of each of the first lead units and each of the second lead units is substantially a line symmetric pattern, the leads in each of the first lead units comprise two first leads and two second leads, the leads in each of the second lead units comprise two first leads and two second leads, and the pattern of each of the first leads is different from the pattern of each of the second leads.

7. The circuit substrate according to claim 6, wherein each of the first leads has a chip carrying portion, and each of the second leads does not have a chip carrying portion.

8. The circuit substrate according to claim 7, wherein each of the first leads has a wire bonding portion, and each of the first leads has at least one flush proof notch located between the chip carrying portion and the wire bonding portion.

9. The circuit substrate according to claim 7, wherein each of the first leads has a wire bonding portion, and each of the first leads has a flush proof opening located between the chip carrying portion and the wire bonding portion.

10. The circuit substrate according to claim 1, wherein the lead units arranged in the same row comprise a plurality of first lead units and a plurality of second lead units, each of the first lead units has a first pattern, each of the second lead units has a second pattern, and the first pattern is different from the second pattern, wherein the first lead units and the second lead units are arranged alternatively along the row direction.

11. The circuit substrate according to claim 10, wherein each of the first lead units comprises a first lead and two second leads, each of the second lead units comprises two first leads and a second lead, and the pattern of each of the first leads is different from the pattern of each of the second leads.

12. The circuit substrate according to claim 10, wherein each of the first lead units comprises three first leads, each of the second lead units comprises three second leads, and the pattern of each of the first leads is different from the pattern of each of the second leads.

13. The circuit substrate according to claim 12, wherein each of the first leads has a chip carrying portion, and each of the second leads does not have a chip carrying portion.

14. The circuit substrate according to claim 13, wherein each of the first leads has a wire bonding portion, and each of the first leads has at least one flush proof notch located between the chip carrying portion and the wire bonding portion.

15. The circuit substrate according to claim 13, wherein each of the first leads has a wire bonding portion, and each of the first leads has a flush proof opening located between the chip carrying 3ortion and the wire bonding portion.

16. A circuit substrate, comprising: a base layer, having a plurality of through grooves; and a plurality of lead units of light-emitting diode (LED) packages, arranged as an array and disposed on the base layer, wherein each of the lead units comprises: a common terminal, substantially equally divided into a plurality of electrodes of a same shape and size, wherein the electrodes are connected with each other; and at least three leads, extended from and in direct contact with an edge of the common terminal, wherein each of the leads is respectively extended from an edge of a respective one of the electrodes and not in contact with any other of the leads, and wherein the through grooves expose the common terminal of the lead units, wherein a pattern of each of the lead units is substantially a point symmetric pattern with respect to a center point of the common terminal, and wherein the at least three leads comprise four leads including a pair of first leads and a pair of second leads with the first leads and the second leads differing in size and shape.

* * * * *